(12) United States Patent
Kim

(10) Patent No.: US 11,901,109 B2
(45) Date of Patent: Feb. 13, 2024

(54) PRIMARY COIL ASSEMBLY FOR TRANSFORMER AND TRANSFORMER INCLUDING THE SAME

(71) Applicant: TransOn Co., Ltd., Seoul (KR)

(72) Inventor: Yongwon Kim, Gwangmyeong-si (KR)

(73) Assignee: TransOn Co., Ltd., Seoul (KR)

( * ) Notice: Subject to any disclaimer, the term of this patent is extended or adjusted under 35 U.S.C. 154(b) by 727 days.

(21) Appl. No.: 17/033,833

(22) Filed: Sep. 27, 2020

(65) Prior Publication Data

US 2022/0068544 A1    Mar. 3, 2022

(30) Foreign Application Priority Data

Aug. 31, 2020    (KR) ........................ 10-2020-0110521

(51) Int. Cl.
| | |
|---|---|
| *H01F 27/28* | (2006.01) |
| *H01F 27/29* | (2006.01) |
| *H01F 41/04* | (2006.01) |
| *H05K 1/02* | (2006.01) |
| *H05K 1/16* | (2006.01) |

(52) U.S. Cl.
CPC ..... *H01F 27/2804* (2013.01); *H01F 27/2885* (2013.01); *H01F 27/29* (2013.01); *H01F 41/041* (2013.01); *H05K 1/0277* (2013.01); *H05K 1/165* (2013.01); *H01F 2027/2809* (2013.01)

(58) Field of Classification Search
CPC ......... H01F 27/2804; H01F 2027/2809; H01F 17/0013; H01F 17/0006; H01F 5/003; H01F 27/29; H01F 27/292; H01F 27/2885; H01F 2027/2819; H05K 1/0277; H05K 1/165

USPC ................................................. 336/200, 232
See application file for complete search history.

(56) References Cited

U.S. PATENT DOCUMENTS

| | | | | |
|---|---|---|---|---|
| 5,179,365 | A  * | 1/1993 | Raggi ................. | H01F 27/2804 336/83 |
| 6,420,953 | B1 * | 7/2002 | Dadafshar ........... | H01F 27/2852 336/200 |
| 2008/0088401 | A1 * | 4/2008 | Wei ..................... | H01F 27/2804 336/182 |
| 2016/0086718 | A1 * | 3/2016 | Tsai ..................... | H01F 27/324 336/221 |
| 2017/0032888 | A1 * | 2/2017 | Park ..................... | H01F 27/325 |
| 2017/0200552 | A1 | 7/2017 | Chung et al. | |

FOREIGN PATENT DOCUMENTS

| | | | | |
|---|---|---|---|---|
| CN | 110233028 A | | 9/2019 | |
| EP | 522475 A1 * | | 1/1993 | ......... H01F 27/2847 |
| KR | 1020160137412 A | | 11/2016 | |

(Continued)

*Primary Examiner* — Tszfung J Chan
(74) *Attorney, Agent, or Firm* — YOU & IP, LLC; Wansik You

(57) ABSTRACT

The primary coil assembly, which includes a primary coil interposed between a pair of secondary coils and configured to perform electromagnetic mutual induction, and includes: a bonding coil having both ends connected to primary-side terminal pins of the transformer; a first PCB member provided on an upper surface of the bonding coil and configured to constitute an upper-side auxiliary winding of the primary coil; and a second PCB member provided on a lower surface of the bonding coil and configured to constitute a lower-side auxiliary winding of the primary coil.

10 Claims, 8 Drawing Sheets

(56) References Cited

FOREIGN PATENT DOCUMENTS

| | | | |
|---|---|---|---|
| KR | 2020170002600 U | 7/2017 | |
| KR | 1851653 B1 * | 4/2018 | ............... H01B 3/30 |
| KR | 102000249 B1 | 7/2019 | |
| KR | 102036488 B1 | 10/2019 | |
| WO | WO-2019009599 A1 * | 1/2019 | ......... H01F 27/2804 |
| WO | 2020244141 A1 | 12/2020 | |

* cited by examiner

PRIMARY COIL ASSEMBLY FOR TRANSFORMER AND TRANSFORMER INCLUDING THE SAME

BACKGROUND

1. Technical Field

The present disclosure relates to a primary coil assembly for a transformer and a transformer including the same, and more particularly, to a primary coil assembly for a transformer which has excellent assembling efficiency, has a simple structure, can be employed in various electronic appliances with low capacity or high capacity, can minimize noise generation due to vibration, and can maintain designed electromagnetic interference (EMI) characteristics, and a transformer including the same.

2. Related Art

Various electronic appliances such as a television (TV), a monitor, a personal computer (PC), and office automation (OA) equipment require various types of power supplies.

Therefore, each electronic appliance is generally provided with a device that converts AC power supplied from an exterior into power required for each electronic application appliance, and a transformer is mainly used as the device.

In general, the transformer is a device that increases or decreases an AC voltage by using an electromagnetic mutual induction, is largely composed of a primary coil, a secondary coil, a magnetic core and the like. In general, the primary coil is used as an input terminal and the secondary coil is used as an output terminal.

The transformer converts AC power of 85 V to 265 V into DC power of 3 V to 30 V with high frequency oscillation of 25 KHz to 100 KHz. Therefore, compared to a general transformer that converts AC power of 85 V to 265 V into AC power of 3 V to 30 V with frequency oscillation of 50 Hz to 0 KHz, the transformer can significantly reduce the size of a core and a bobbin and stably supply low voltage and low current DC power to electronic application appliances. Thus, the transformer is widely used in electronic application appliances that are in the recent trend of miniaturization.

FIG. 1 is an exploded perspective view of a transformer 1 according to the related art.

As illustrated in FIG. 1, the transformer 1 includes lower and upper cores 10a and 10b, a primary coil 40, lower and upper secondary coils 30a and 30b, and lower and upper brackets 20a and 20b.

The lower and upper brackets 20a and 20b serve as bobbin bodies that hold and fix the coils.

Specifically, the lower and upper cores 10a and 10b are provided with a central leg 12 and outer legs 11.

The primary coil 40 is formed with an insertion hole 41 into which the central leg 12 is inserted and insertion holes 42 into which external lead pins (not illustrated) protruding the exterior of the lower and upper cores 10a and 10b are inserted.

Furthermore, each of the lower and upper secondary coils 30a and 30b is composed of a multi-insulating wire 32 that can be insulated by surrounding an inner conductor wire 31, which has an insulating distance from a conductor pattern of the primary coil 40, with at least two insulators. The multi-insulating wire 32 is disposed in a space formed between the central leg 12 and the outer legs 11 of the lower and upper cores 10a and 10b, and may be wound around the central leg 12.

Furthermore, each of the lower and upper brackets 20a and 20b serving as the bobbin body is formed with an insertion hole 21 into which the central leg 12 is inserted, and bending portions 22 are formed before and after the insertion hole 21 so that the wires 31 and 32 of the lower and upper secondary coils 30a and 30b are drawn out when the lower and upper secondary coils 30a and 30b are inserted and assembled into the lower and upper cores 10a and 10b and the assembled state of the lower and upper secondary coils 30a and 30b is maintained in their original positions.

In the transformer 1 including the lower and upper brackets 20a and 20b configured as above, when the primary coil is composed of a bonding coil, and particularly, both a main winding and an auxiliary winding are composed of bonding coils, inner and outer sizes are inconsistent, which causes noise and vibration, and tilting occurs during assembly, resulting in deterioration in efficiency and electromagnetic interference (EMI) characteristics.

Furthermore, when the primary coil is composed of only a multilayer PCB, it is difficult to cope with design diversification (product tuning), and cost increases as the capacity increases.

[Patent Document 1] Korean Patent No. 10-2036488 (published on Oct. 25, 2019)
[Patent Document 2] Korean Patent No. 10-2000249 (published on Jul. 16, 2019)
[Patent Document 3] Korean Utility Model Application Laid-open No. 20-2017-0002600 (published on Jul. 18, 2017)

SUMMARY

Various embodiments are directed to providing a primary coil assembly for a transformer, which has excellent assembling efficiency, has a simple structure, can be employed in various electronic appliances with low capacity or high capacity, can minimize noise generation due to vibration, and can maintain designed electromagnetic interference (EMI) characteristics, and a transformer including the same.

Problems to be solved by the present disclosure are not limited to the aforementioned problems, and other unmentioned problems will be clearly understood by those skilled in the art from the following description.

A primary coil assembly for a transformer according to one aspect of the present disclosure, which includes a primary coil interposed between a pair of secondary coils and configured to perform electromagnetic mutual induction, includes: a bonding coil having both ends connected to primary-side terminal pins of the transformer; a first PCB member provided on an upper surface of the bonding coil and configured to constitute an upper-side auxiliary winding of the primary coil; and a second PCB member provided on a lower surface of the bonding coil and configured to constitute a lower-side auxiliary winding of the primary coil.

In an aspect of the present disclosure, preferably, the first PCB member and the second PCB member are each formed of a flexible printed circuit board (FPCB), or a hard printed circuit board (HPCB).

In an aspect of the present disclosure, the bonding coil may be formed of a bonding coil selected from a flat bonding coil, a litz wire (LITZ) bonding coil, a ustc wire (USTC) bonding coil, and a LITZ-USTC bonding coil, and may be wound by a winding method of a solenoid winding or an alpha (a) winding.

In an aspect of the present disclosure, preferably, the first PCB member is formed of the hard printed circuit board (HPCB) in which a pair of outer terminal pin connection parts extending outward are formed, and the second PCB member is formed of the flexible printed circuit board (FPCB) in which a pair of outer terminal pin connection parts extending outward are formed and one inner terminal pin connection part extending inward is formed.

In an aspect of the present disclosure, the first PCB member may be formed of one to four winding pattern layers, and when the first PCB member is formed of a plurality of winding pattern layers, neighboring winding pattern layers may be formed to be electrically conductive through via holes.

In an aspect of the present disclosure, the second PCB member may be formed of a single FPCB in which two winding pattern layers are formed.

In an aspect of the present disclosure, the inner terminal pin connection part may be located on the same extension line as one of the pair of outer terminal pin connection parts.

In an aspect of the present disclosure, the inner terminal pin connection part may be formed twice as long as the outer terminal pin connection part.

In an aspect of the present disclosure, the inner terminal pin connection part may be bent around a proximal end to overlap one of the pair of outer terminal pin connection parts, and the overlapping inner terminal pin connection part and outer terminal pin connection part may be connected to a terminal pin of the transformer.

In an aspect of the present disclosure, the first PCB member or the second PCB member may be formed of an HPCB or an epoxy HPCB in which one winding pattern layer is formed, and the one winding pattern layer may be formed of a winding pattern layer for shield wire or a ground pattern layer.

In an aspect of the present disclosure, the first PCB member or the second PCB member may be formed of an FPCB or an HPCB having two winding pattern layers, and the two winding pattern layers may include a first winding pattern layer including one of a winding pattern layer for shield wire and a ground pattern layer or a shield-ground winding pattern layer in which both a winding pattern layer for shield wire and a ground pattern layer are formed on the same layer, and a second winding pattern layer including a winding pattern layer for Vcc.

In an aspect of the present disclosure, the first PCB member or the second PCB member may be formed of an HPCB or an epoxy HPCB having three or four winding pattern layers, and the three or four winding pattern layers may be formed by combining a winding pattern layer for Vcc, a winding pattern layer for shield wire, and a shield-ground winding pattern layer in which both a winding pattern layer for shield wire and a ground pattern layer are formed on the same layer.

A transformer according to another aspect of the present disclosure includes the primary coil assembly for a transformer according to the aforementioned one aspect.

In the primary coil assembly for a transformer and the transformer including the same according to the present disclosure, the auxiliary winding of the flexible printed circuit board and/or the hard printed circuit board is configured in the bonding coil, which is a main winding, which makes it possible to provide a transformer which has a simple structure, can be employed in various electronic appliances with low capacity or high capacity, can minimize noise generation due to vibration, and can maintain designed electromagnetic interference (EMI) characteristics. Furthermore, the inner terminal part can be directly connected to the outer terminal part, which makes it possible to improve assembling efficiency.

The effects of the present disclosure are not limited to the aforementioned effects, and other unmentioned problems will be clearly understood by those skilled in the art from the following description.

DETAILED DESCRIPTION

Figure 1:
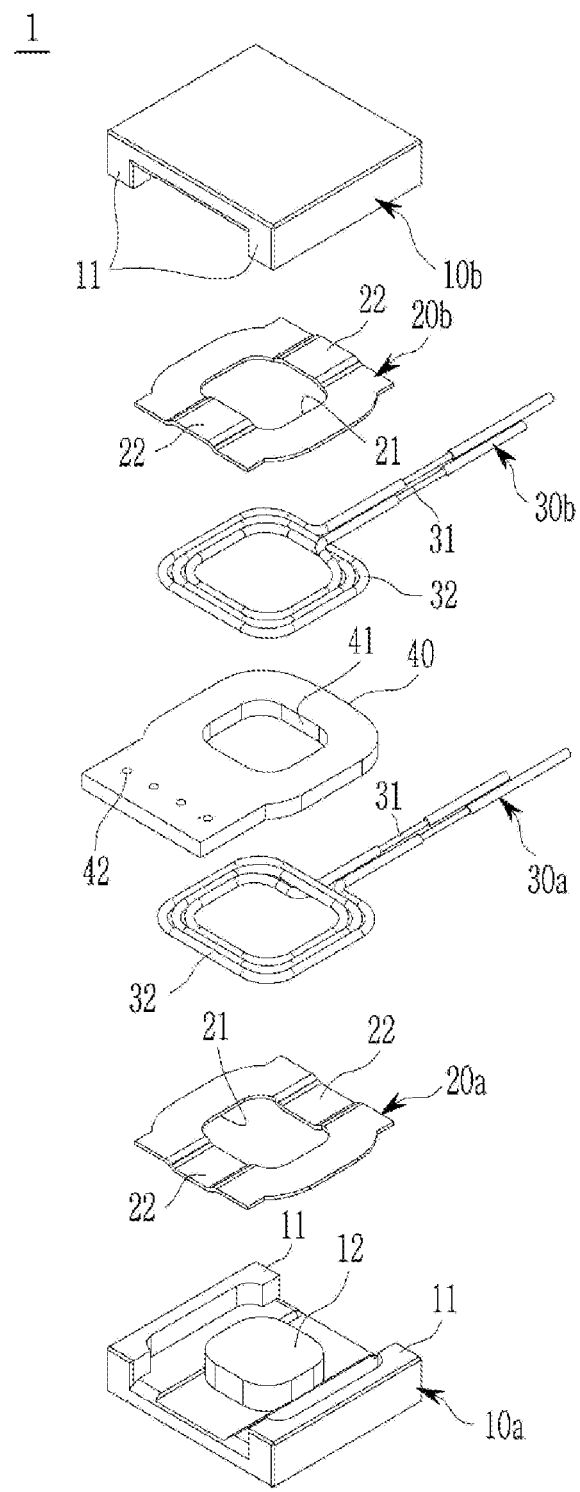
FIG. 1 is an exploded perspective view of a transformer having a primary coil according to the related art.

Hereinafter, specific embodiments according to the present disclosure will be described with reference to the accompanying drawings. However, the present disclosure is not intended to be limited to specific embodiments and should be construed to include all modifications, equivalents, and alternatives included in the spirit and scope of the present disclosure.

Elements having similar configurations and operations throughout the specification are denoted by the same reference numerals. The accompanying drawings of the present disclosure are for convenience of description and the shapes and relative scales may be exaggerated or omitted.

In describing the embodiments in detail, redundant descriptions or descriptions of technologies that are obvious in the art have been omitted. Furthermore, in the following description, when a part is referred to as "including" another component, it means that the part may further include components in addition to the described component unless otherwise stated.

Furthermore, a term such as " . . . unit", " . . . or (or . . . er)", and " . . . module" described in this specification means a unit for processing at least one function or operation, and this may be implemented with hardware, software, or a combination of the hardware and the software. Furthermore, when a part is referred to as being electrically connected to another part, it may indicate the part is directly connected to the another part or connected to the another part with another configuration interposed therebetween.

Terms including ordinal numbers such as first and second may be used to describe various components, but the components are not limited by the terms. The terms are used only to distinguish one component from another component. For example, a second component may be referred to as a first component and similarly, the first component may also be referred to as the second component without departing from the scope of the present disclosure.

Hereinafter, a primary coil assembly for a transformer and a transformer including the same according to preferred embodiments of the present disclosure will be described in detail with reference to the accompanying drawings.

Figure 2:
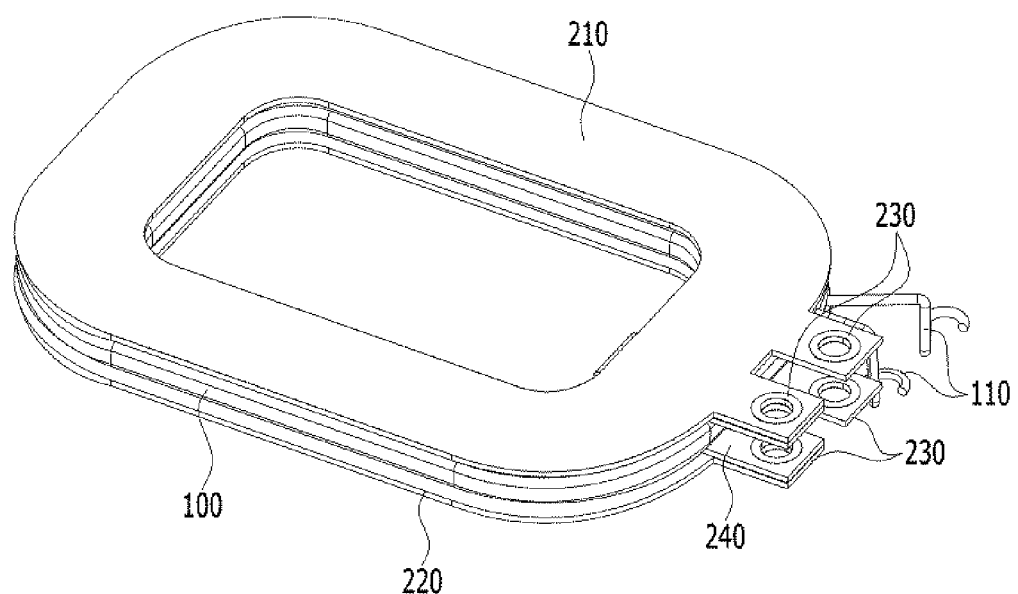
FIG. 2 is a perspective view of a primary coil assembly for a transformer according to the present disclosure.
Figure 3:
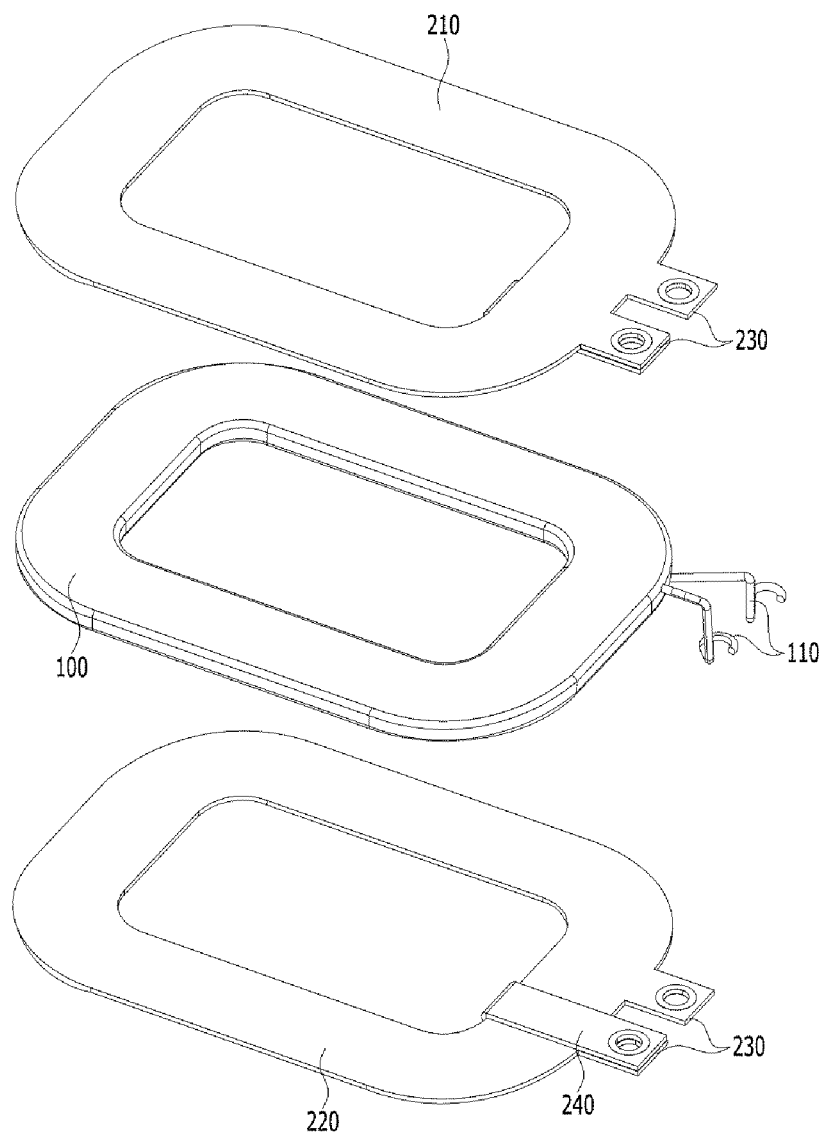
FIG. 3 is an exploded perspective view of the primary coil assembly for a transformer according to the present disclosure.
Figure 4:
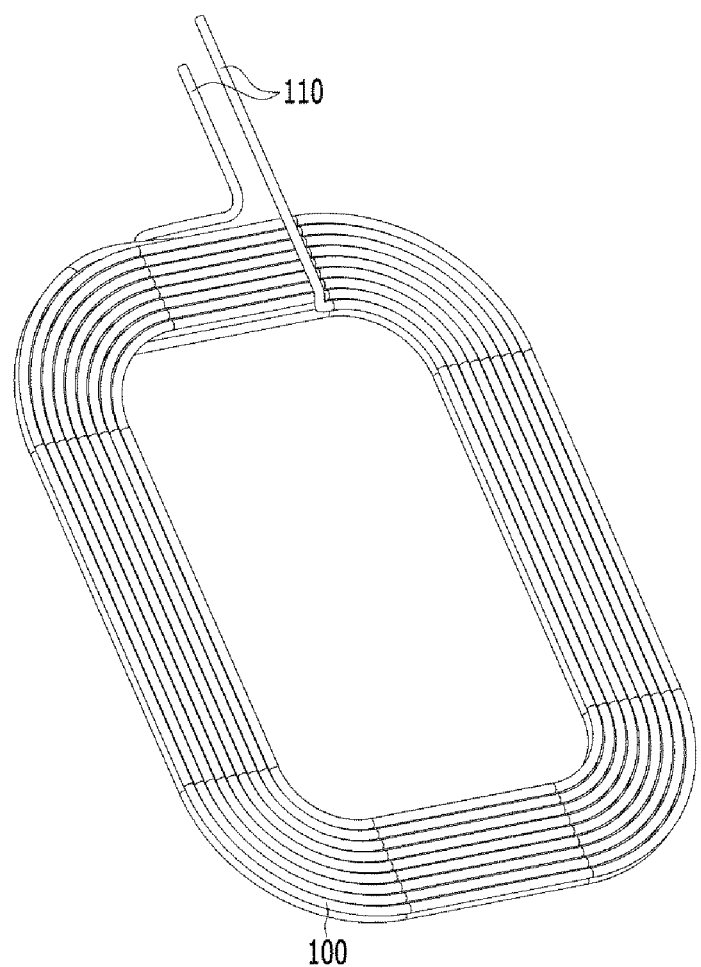
FIG. 4 is a view illustrating an example of a bonding coil constituting the primary coil assembly for a transformer according to the present disclosure.
Figure 5:
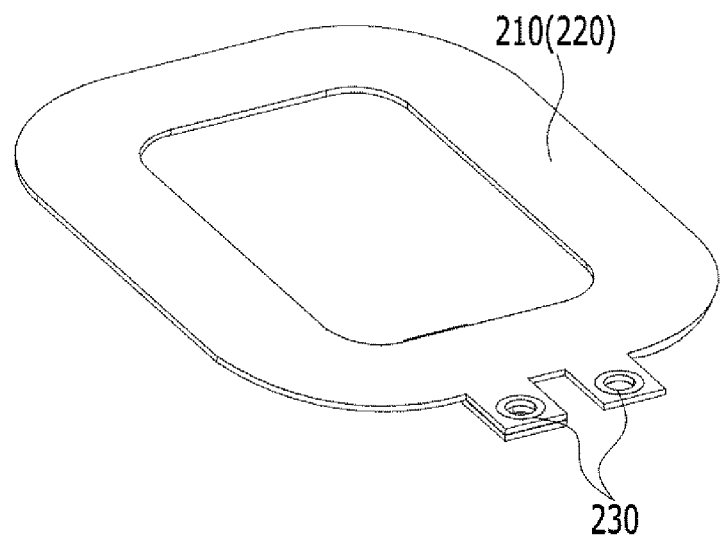
FIG. 5 is a perspective view illustrating an embodiment of a PCB member constituting the primary coil assembly for a transformer according to the present disclosure.
Figure 6:
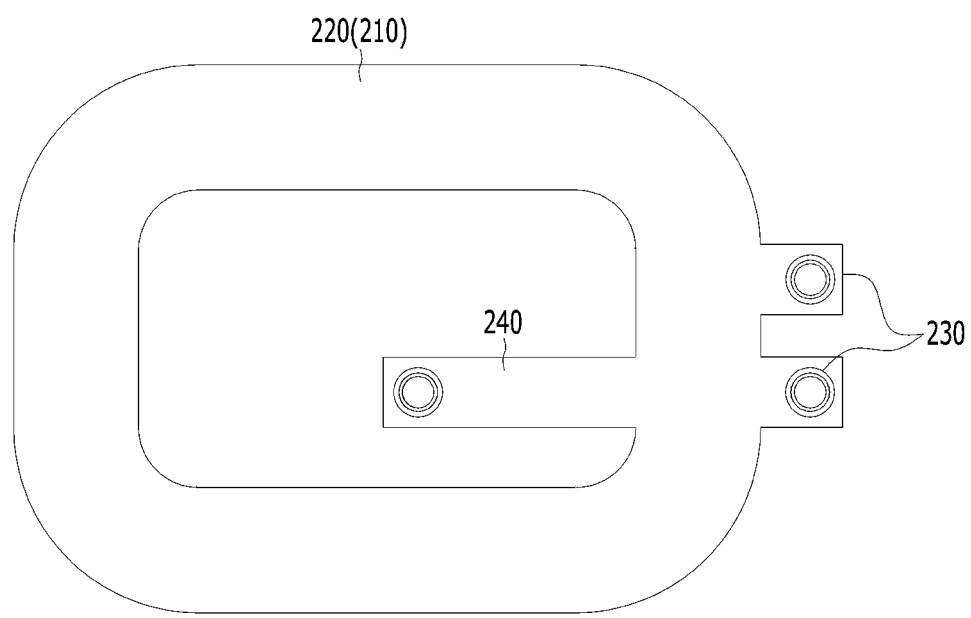
FIG. 6 is a plan view illustrating an embodiment of the PCB member constituting the primary coil assembly for a transformer according to the present disclosure.
Figure 7:
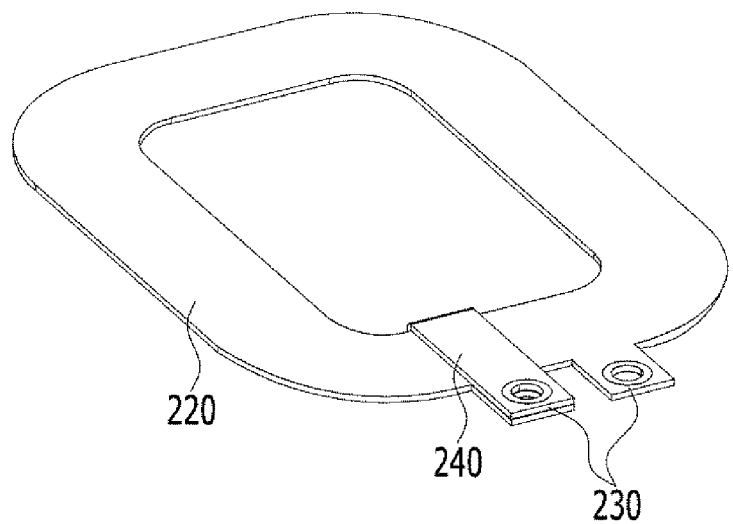
FIG. 7 is a perspective view illustrating a use state of an embodiment of FIG. 6 in which an extension part for an inner terminal provided on the PCB member is connected to an extension part for an outer terminal.
Figure 8:
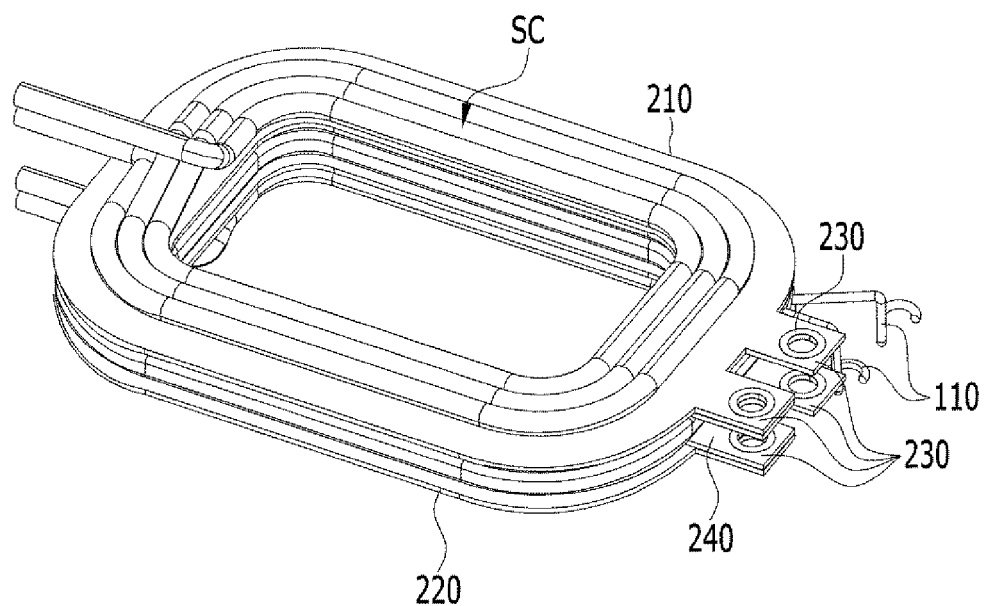
FIG. 8 is a perspective view when a state, in which secondary coils are provided on the upper and lower surfaces of the primary coil assembly for a transformer according to the present disclosure, is viewed from above.
Figure 9:
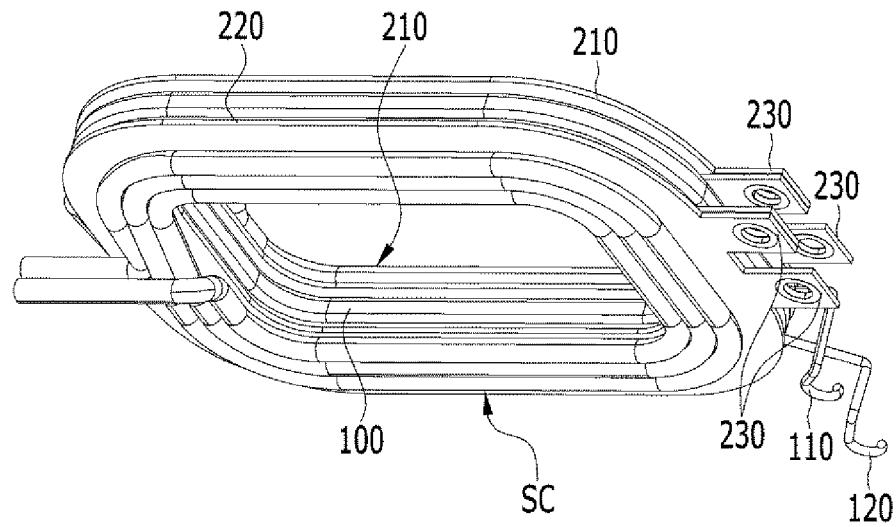
FIG. 9 is a perspective view when the state, in which the secondary coils are provided on the upper and lower surfaces of the primary coil assembly for a transformer according to the present disclosure, is viewed from below.
Figure 10:
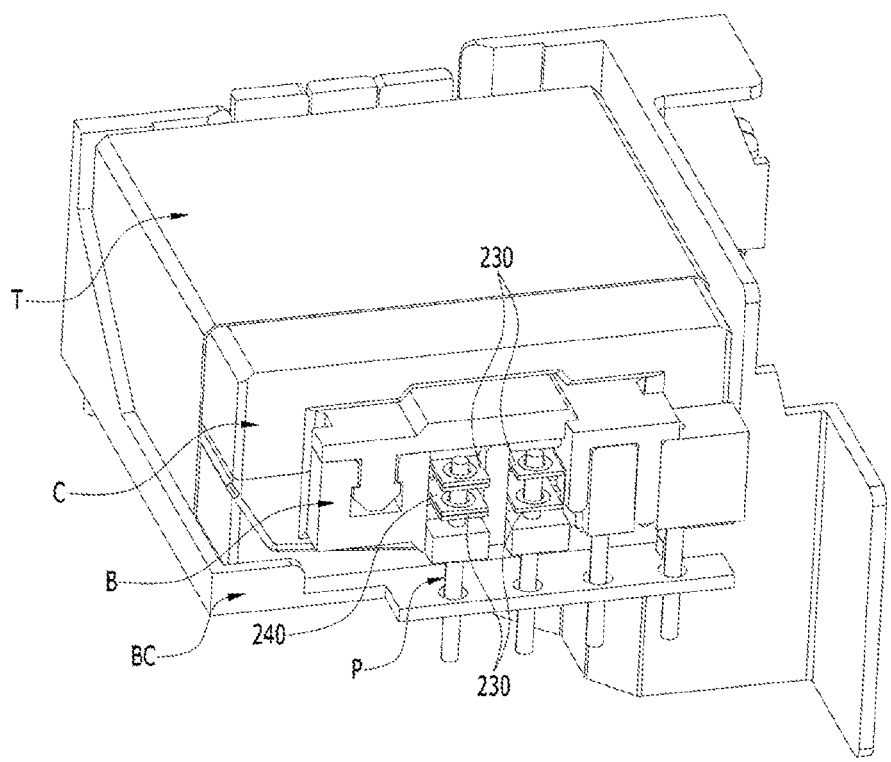
FIG. 10 is a perspective view illustrating a transformer including the primary coil assembly for a transformer according to the present disclosure.
Figure 11:
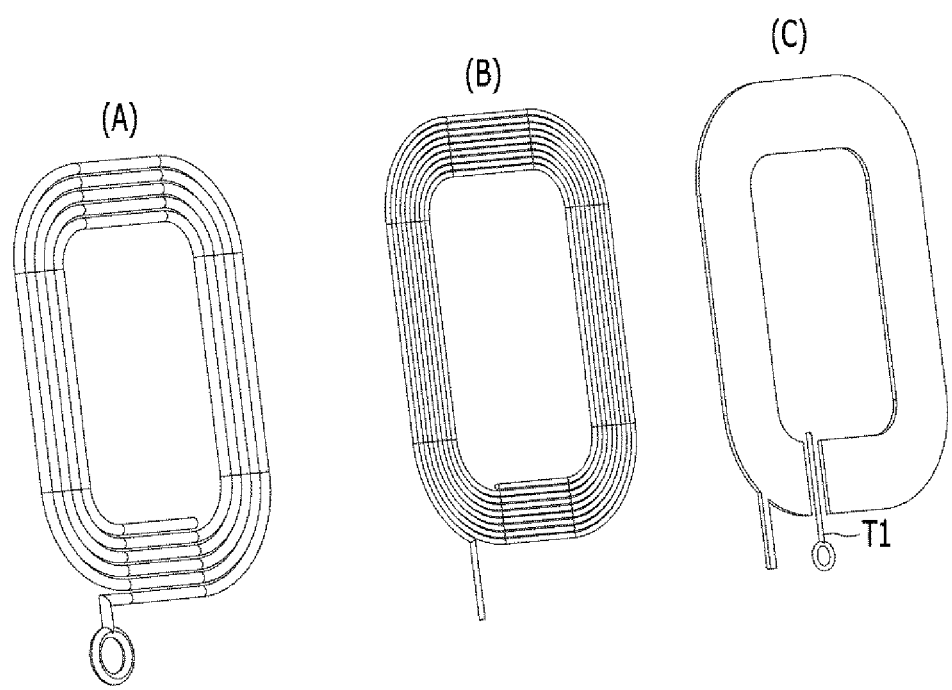
FIG. 11 illustrates embodiments of winding pattern layers of first and second PCB members constituting the transformer including the primary coil assembly for a transformer according to the present disclosure, wherein (A) of FIG. 11 illustrates an example of a winding pattern layer for Vcc, (B) of FIG. 11 illustrates an example of a winding pattern layer for shield wire, and (C) of FIG. 11 is a view illustrating an example of a ground pattern layer.

FIG. 2 is a perspective view of a primary coil assembly for a transformer according to the present disclosure, FIG. 3 is an exploded perspective view of the primary coil assembly for a transformer according to the present disclosure, FIG. 4 is a view illustrating an example of a bonding coil constituting the primary coil assembly for a transformer according to the present disclosure, FIG. 5 is a perspective view illustrating an embodiment of a PCB member constituting the primary coil assembly for a transformer according to the present disclosure, FIG. 6 is a plan view illustrating an embodiment of the PCB member constituting the primary coil assembly for a transformer according to the present disclosure, and FIG. 7 is a perspective view illustrating a use state of an embodiment of FIG. 6 in which an extension part for an inner terminal provided on the PCB member is connected to an extension part for an outer terminal. FIG. 8 is a perspective view when a state, in which secondary coils are provided on the upper and lower surfaces of the primary coil assembly for a transformer according to the present disclosure, is viewed from above, FIG. 9 is a perspective view when the state, in which the secondary coils are provided on the upper and lower surfaces of the primary coil assembly for a transformer according to the present disclosure, is viewed from below, FIG. 10 is a perspective view illustrating a transformer including the primary coil assembly for a transformer according to the present disclosure, and FIG. 11 illustrates embodiments of winding pattern layers of first and second PCB members constituting the transformer including the primary coil assembly for a transformer according to the present disclosure, wherein (A) of FIG. 11 illustrates an example of a winding pattern layer for Vcc, (B) of FIG. 11 illustrates an example of a winding pattern layer for shield wire, and (C) of FIG. 11 is a view illustrating an example of a ground pattern layer.

As illustrated in FIG. 2 to FIG. 10, the primary coil assembly for a transformer according to the present disclosure largely includes a bonding coil 100, a first PCB member 210, and a second PCB member 220 in a primary coil configured as an input-side coil part in the transformer.

Specifically, as illustrated in FIG. 2 to FIG. 10, the primary coil assembly for a transformer according to the present disclosure is configured in a transformer, and includes the bonding coil 100 constituting a main winding of the primary coil, the first PCB member 210 provided on an upper surface of the bonding coil 100 and configured to constitute an upper-side auxiliary winding of the primary coil, and the second PCB member 220 provided on a lower surface of the bonding coil 100 and configured to constitute a lower-side auxiliary winding of the primary coil, in the primary coil as the input-side coil part interposed between a pair of secondary coils and configured to perform electromagnetic mutual induction.

The bonding coil 100 is a component for constituting the main winding of the primary coil, is formed by winding with a predetermined number of turns, and is provided on one side thereof with terminal pin connection terminals 110 and 120 for terminal pin connection.

More specifically, the bonding coil 100 may be formed of a bonding coil selected from a flat bonding coil, a litz wire (LITZ) bonding coil, a ustc wire (USTC) bonding coil, and a LITZ-USTC bonding coil, and may be wound by a winding method of a solenoid winding or an alpha (a) winding.

The alpha (a) winding has an advantage in that a leader line does not protrude because a start line and an end line are located outside.

As illustrated in FIG. 3, a pair of terminal pin connection parts (outer terminal pin connection parts) 230 extending outward are integrally formed on one side of the first PCB member 210. The pair of terminal pin connection parts 230 are electrically connected to terminal pins provided in a bobbin as illustrated in FIG. 9.

Each of the terminal pin connection parts 230 is formed with a connection hole for electrical connection to the terminal pin.

The first PCB member 210 may be formed of a flexible printed circuit board (FPCB), or a hard printed circuit board (HPCB) (or an epoxy PCB).

When the first PCB member 210 is formed of the FPCB, it is formed of a single FPCB in which two winding pattern layers are formed.

When the first PCB member 210 is formed of the FPCB having two winding pattern layers, the two winding pattern layers may include a first winding pattern layer including one of a winding pattern layer for shield wire and a ground pattern layer or a shield-ground winding pattern layer in which the winding pattern layer for shield wire and the ground pattern layer are simultaneously implemented, and a second winding pattern layer including a winding pattern layer for Vcc.

That is, when the first PCB member 210 is formed of the FPCB having two winding pattern layers, the two winding pattern layers may be selected from the winding pattern layer for Vcc and the winding pattern layer for shield wire (Vcc+Shield wire), the winding pattern layer for Vcc and the ground pattern layer (Vcc+Ground Pattern), and the winding pattern layer for Vcc and the shield-ground winding pattern layer (Vcc+Shield-Ground Pattern).

For example, the first PCB member 210 may be formed of the FPCB having two winding pattern layers, that is, may be formed of a winding pattern layer for Vcc as illustrated in (A) of FIG. 11 and a winding pattern layer for shield wire as illustrated in (B) of FIG. 11, a ground pattern layer as illustrated in (C) of FIG. 11, or a shield-ground winding pattern layer in which both the winding pattern layer for shield wire of (B) of FIG. 11 and the ground pattern layer of (C) of FIG. 11 are implemented on a single layer.

In (C) of FIG. 11, reference numeral T1 denotes a terminal pattern for inner end connection, which is electrically connected an inner end of the winding pattern layer for Vcc through a via hole at one end thereof.

When the first winding pattern layer of the first PCB member 210 is formed of the shield-ground winding pattern layer in which the winding pattern layer for shield wire in (B) of FIG. 11 and the ground pattern layer in (C) of FIG. 11 are implemented on a single layer, one side thereof may be formed of the winding pattern layer for shield wire and the other side thereof may be formed of the ground pattern layer around a center line of the shield-ground winding pattern layer according to an embodiment. According to another embodiment, the inside or outside thereof may be formed of the winding pattern layer for shield wire and the outside or inside thereof may be formed of the ground pattern layer.

Furthermore, when the first PCB member 210 is formed of the HPCB or the epoxy PCB, it may be formed of one to four winding pattern layers.

That is, when the first PCB member 210 is formed of the HPCB or the epoxy PCB, it may be formed of one to four winding pattern layers obtained by using the winding pattern layer for Vcc (Vcc), the winding pattern layer for shield wire (Shield wire), the ground pattern layer (Ground Pattern), and the shield-ground winding pattern layer (Shield-Ground Pattern) either alone or in combination thereof, as illustrated in FIG. 11.

When the first PCB member 210 is formed of two or more winding pattern layers, neighboring respective layers are electrically connected though via holes.

Specifically, when the first PCB member 210 is formed of the HPCB or the epoxy PCB having one winding pattern layer, the one winding pattern layer may be formed of one of the winding pattern layer for shield wire (Shield wire) and the ground pattern layer (Ground Pattern).

When the first PCB member 210 is formed of the HPCB or the epoxy PCB having two winding pattern layers, the two winding pattern layers may be formed of the winding pattern layer for Vcc and the ground pattern layer (Vcc+Ground Pattern).

Furthermore, when the first PCB member 210 is formed of the HPCB or the epoxy PCB having three winding pattern layers, the three winding pattern layers may be formed of the winding pattern layer for Vcc and the winding pattern layer for shield wire (Vcc+Shield wire), the winding pattern layer for Vcc, or the winding pattern layer for shield wire and the ground pattern layer (Vcc+Shield wire+Ground Pattern).

Of course, the first PCB member 210 may also be formed in the form of the second PCB member 220 to be described below.

Subsequently, as illustrated in FIG. 5 and FIG. 6, a pair of outer terminal pin connection parts 230 extending outward are integrally formed on one side of the second PCB member 220 and one inner terminal pin connection part 240 extending inward is formed on the other side thereof.

The inner terminal pin connection part 240 is located on the same extension line as one of the pair of outer terminal pin connection parts 230. The inner terminal pin connection part 240 is formed twice as long as the outer terminal pin connection part 230.

The outer terminal pin connection parts 230 and the inner terminal pin connection part 240 are formed with connection holes for electrical connection to terminal pins.

Preferably, the second PCB member 220 is formed of a flexible printed circuit board (FPCB).

Accordingly, the inner terminal pin connection part 240 is bent to be connected to the terminal pin while overlapping one of the outer terminal pin connection parts 230.

Preferably, the second PCB member 220 is formed of a single FPCB in which two winding pattern layers are formed.

When the second PCB member 220 is formed of the FPCB, the two winding pattern layers may be formed in the same manner as described above with reference to the first PCB member 210.

Furthermore, the second PCB member 220 may be formed of the HPCB having one to four winding pattern layers. In such a case, the one to four winding pattern layers may be formed in the same manner as described above with reference to the first PCB member 210.

In the primary coil assembly for a transformer according to the present disclosure as described above, as illustrated in FIG. 9, the bonding coil 100 and the terminal pin connection parts 230 and 240 of the first and second PCB members 210 and 220 of the primary coil are connected to terminal pins P for a primary coil provided on one side of a bobbin B.

On the other side of the bobbin B, that is, the side opposite to the side where the terminal pins P for a primary coil are formed, terminal pins for secondary coils, to which secondary coils SC provided on the upper and lower sides of the primary coil assembly for a transformer according to the present disclosure are connected, are formed.

In FIG. 9, reference numeral C denotes upper and lower cores, reference numeral T denotes an insulating tape, and reference numeral BC denotes a base.

In accordance with the primary coil assembly for a transformer and a transformer including the same according to the present disclosure as described above, the auxiliary winding of the flexible printed circuit board and/or the hard printed circuit board is configured in the bonding coil, which is a main winding, which makes it possible to provide a transformer which has a simple structure, can be employed in various electronic appliances with low capacity or high capacity, can minimize noise generation due to vibration, and can maintain designed electromagnetic interference (EMI) characteristics. Furthermore, the inner terminal part can be directly connected to the outer terminal part, which makes it possible to improve assembling efficiency.

The present disclosure can be variously modified without impairing the basic sprit thereof. That is, all the above embodiments should be construed to be illustrative and is not construed to be limitative. Accordingly, the protection scope of the present disclosure should be defined according to the accompanying claims rather than the above embodiments, and when elements defined in the accompanying claims are replaced with equivalents thereof, this should be deemed to fall within the scope of the present disclosure.

What is claimed is:

1. A primary coil assembly for a transformer, which includes a primary coil interposed between a pair of secondary coils and configured to perform electromagnetic mutual induction, the primary coil assembly comprising:
    a bonding coil having both ends connected to primary-side terminal pins of the transformer;
    a first PCB member provided on an upper surface of the bonding coil and configured to constitute an upper-side auxiliary winding of the primary coil; and
    a second PCB member provided on a lower surface of the bonding coil and configured to constitute a lower-side auxiliary winding of the primary coil;
    wherein the first PCB member is formed of a hard printed circuit board (HPCB) or an epoxy HPCB in which a pair of outer terminal pin connection parts extending outward are formed, and the second PCB member is formed of a flexible printed circuit board (FPCB) in which a pair of outer terminal pin connection parts extending outward are formed and one inner terminal pin connection part extending inward is formed; and wherein the inner terminal pin connection part is bent around a proximal end to overlap one of the pair of outer terminal pin connection parts, and the overlapping inner terminal pin connection part and outer terminal pin connection part are connected to a terminal pin of the transformer.

2. The primary coil assembly according to claim 1, wherein the bonding coil is formed of a bonding coil selected from a flat bonding coil, a litz wire (LITZ) bonding coil, a ustc wire (USTC) bonding coil, and a LITZ-USTC bonding coil, and is wound by a winding method of a solenoid winding or an alpha (α) winding.

3. The primary coil assembly according to claim 1, wherein the first PCB member is formed of one to four winding pattern layers, and when the first PCB member is formed of a plurality of winding pattern layers, neighboring winding pattern layers are formed to be electrically conductive through via holes.

4. The primary coil assembly according to claim 1, wherein the second PCB member is formed of a single FPCB in which two winding pattern layers are formed.

5. The primary coil assembly according to claim 1, wherein the inner terminal pin connection part is located on the same extension line as one of the pair of outer terminal pin connection parts.

6. The primary coil assembly according to claim 5, wherein the inner terminal pin connection part is formed twice as long as the outer terminal pin connection part.

7. The primary coil assembly according to claim 1, wherein the first PCB member or the second PCB member is formed in which one winding pattern layer is formed, and the one winding pattern layer is formed of a winding pattern layer for shield wire or a ground pattern layer.

8. The primary coil assembly according to claim 1, wherein the first PCB member or the second PCB member is formed having two winding pattern layers, and
the two winding pattern layers include a first winding pattern layer including one of a winding pattern layer for shield wire and a ground pattern layer or a shield-ground winding pattern layer in which both a winding pattern layer for shield wire and a ground pattern layer are formed on the same layer, and a second winding pattern layer including a winding pattern layer for Vcc.

9. The primary coil assembly according to claim 1, wherein the first PCB member or the second PCB member is formed having three or four winding pattern layers, and
the three or four winding pattern layers are formed by combining a winding pattern layer for Vcc, a winding pattern layer for shield wire, and a shield-ground winding pattern layer in which both a winding pattern layer for shield wire and a ground pattern layer are formed on the same layer.

10. The transformer comprising the primary coil assembly for a transformer according to claim 1.

* * * * *